(12) United States Patent
Gaynes et al.

(10) Patent No.: US 6,893,523 B2
(45) Date of Patent: May 17, 2005

(54) METHOD FOR BONDING HEAT SINKS TO OVERMOLD MATERIAL

(75) Inventors: Michael Gaynes, Vestal, NY (US); William R. Hill, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 382 days.

(21) Appl. No.: 10/085,313

(22) Filed: Feb. 28, 2002

(65) Prior Publication Data

US 2002/0079048 A1 Jun. 27, 2002

Related U.S. Application Data

(60) Continuation-in-part of application No. 09/757,185, filed on Jan. 9, 2001, now Pat. No. 6,719,871, which is a division of application No. 09/248,341, filed on Feb. 11, 1999, now Pat. No. 6,206,997.

(51) Int. Cl.[7] .............................................. H01L 23/34
(52) U.S. Cl. .................. 156/153; 156/272.6; 156/275.7
(58) Field of Search .......................... 156/272.6, 275.7, 156/153; 438/122, 126; 257/706, 717; 29/855, 856

(56) References Cited

U.S. PATENT DOCUMENTS

| | | | |
|---|---|---|---|
| 4,938,992 A | 7/1990 | Mears | |
| 5,362,680 A | 11/1994 | Heinen et al. | |
| 5,422,788 A | 6/1995 | Heinen et al. | |
| 5,450,283 A | * 9/1995 | Lin et al. | 361/704 |
| 5,484,324 A | 1/1996 | Okabayashi et al. | |
| 5,655,703 A | 8/1997 | Jimarez et al. | |
| 5,726,079 A | 3/1998 | Johnson | |
| 5,729,440 A | 3/1998 | Jimarez et al. | |
| 5,900,096 A | 5/1999 | Zemel | |
| 5,938,854 A | * 8/1999 | Roth | 134/1 |
| 6,206,997 B1 | 3/2001 | Egitto et al. | |
| 6,309,494 B1 | * 10/2001 | Koch et al. | 156/153 |

FOREIGN PATENT DOCUMENTS

JP         4266938         9/1992

OTHER PUBLICATIONS

IBM Technical Disclosure Bulletin vol. 26, No. 3B, Aug., 1983, "Fiber–Optic Connector" by Uberbacher.

* cited by examiner

*Primary Examiner*—John T. Haran
(74) *Attorney, Agent, or Firm*—William N. Hogg

(57) ABSTRACT

A method and resulting electronic package in which a heat sink is secured to the package's dielectric material (e.g., overmold). The surface of the dielectric is roughened (e.g., using an abrasive paper or pad) to enhance the subsequent dielectric-heat sink bond in which an adhesive is used. The dielectric material's roughened external surface(s), typically containing silicone material (e.g., silicone residue) which is an inherent by-product of many dielectric materials of the type used in such packaging, is (are) able to still be securely attached to the heat sink, despite the presence of said silicone. In another embodiment, the roughened surface enhances the marking of dielectric material of this type (e.g., using ink).

4 Claims, 3 Drawing Sheets

METHOD FOR BONDING HEAT SINKS TO OVERMOLD MATERIAL

CROSS-REFERENCE TO CO-PENDING APPLICATION

This is a continuation-in-part application of Ser. No. 09/757,185, filed Jan. 9, 2001 now U.S. Pat. No. 6,719,871, which is a divisional application of Ser. No. 09/248,341, filed Feb. 11, 1999 now U.S. Pat. No. 6,206,997.

TECHNICAL FIELD

This invention relates to the bonding of articles to electronic component packages. More specifically, the invention relates to a method for bonding heat sinks to overmold material which is part of such a package.

BACKGROUND OF THE INVENTION

Electronic packages, such as those which use semiconductor devices (chips), are used in increasing numbers in a wide variety of products. Generally, such electronic packages produce heat during operation. In some devices, the heat generated by the package's chip may build in the package and damage the package. Accordingly, there is often a need to dissipate the heat generated by electronic packages to extend the life of such packages.

Various ways of dissipating heat generated from electronic packages have been developed. One common method is to provide a fan in the device or adjacent thereto to blow air through the device and to vent the heated air. Unfortunately, a fan cannot always be provided because such packages are typically very small and/or located in a close environment with other components (e.g., on a circuit board). Another way to increase heat dissipation from an electronic device involves increasing the surface area of the device. According to well recognized heat transfer principles, increasing the surface area will cause an increased transfer of heat from the electronic component to its surroundings. As stated, however, it is generally desirable that electronic components be as small as possible. Yet another way to dissipate heat is to bond an electronic component to a heat sink. The purpose of the heat sink is to conduct heat away from the electronic package insulative cover material and then dissipate the heat from the heat sink. Heat sinks are typically made from a heat conductive material, such as metal, and aluminum is frequently used since it is lightweight and readily available. Such heat sinks can easily be designed to conduct heat away from the electrical component while simultaneously providing a large surface area for heat dissipation. For example, the heat sink may include integral fins that provide a large surface area for a relatively small volume.

While heat sinks solve some of the problems of heat dissipation, there remains a current problem of bonding a heat sink to an electronic component, as discussed in the aforementioned application Ser. No. 09/757,185, which is incorporated herein by reference. For the heat generated through the package's cover (or overmold) member to be transferred to the heat sink, a connection allowing heat conductance between the cover and the heat sink must exist. Conventionally, heat sinks are mechanically attached to electronic components and a heat conducting thermal grease is placed between the cover and the heat sink, thus providing heat conductance as needed. Unfortunately, mechanical attachment possesses serious disadvantages. First, such mechanical attachments require thermal grease, clips, and/or rivets, and other materials, increasing the material cost of the final package. Second, the mechanical attachments increase the process costs, and third, some mechanical attachments have proven to possess poor long term reliability. In other words, either the conductive path between the cover and heat sink is compromised or the mechanical attachment fails altogether. In addition, devices such as rivets can put stress on the electronic package and may even cause failure of the package during thermal expansion and contraction.

One attempt at resolving the problem of mechanical attachment involves using adhesive to create a uniform bond between the package's cover (overmold) member and a heat sink. Unfortunately, many electronic packages are made of substances or are assembled with substances to which it is very difficult to adhere a heat sink. Typical adhesives that are expected to bond to polymer compounds will not effective bond a heat sink to polymer compounds typically used as package overmold materials. This problem has been encountered in the production of plastic ball grid array (PBGA) packages, in particular, PBGA packages with an overmold cover over the package's chip(s). Examples of such packages are defined in U.S. Pat. Nos. 6,206,997, 5,729,440, 5,726,079 and 5,655,703. All of these patents, assigned to the assignee of this invention, are incorporated herein by reference.

In the aforementioned Ser. No. 09/757,185, and in its parent U.S. Pat. No. 6,206,997, there is defined an improved process for attaching a heat sink to the package's overmold material. This process involves exposing the formed overmold to a plasma for a sufficient period so as to assure at least partial conversion of silicon-containing residue to silica. Silicon is a known and often preferred material to be used when forming the overmold member. Silica conversion on the overmold's surface enhances subsequent heat sink attachment using a desired adherent material, e.g., a silicone-based paste adhesive (it being believed that the silicon in the adhesive interacts with the formed silica on the overmold's surface to produce a strong bond). In this embodiment, a metal oxide filler, e.g., alumina, is preferably added to improve the adhesive's heat conductivity from the overmold to the heat sink positioned thereon.

As understood from the following, the present invention defines another improvement to a process for attaching heat sinks to overmold members of an electronic package, and particularly when a process similar to that in defined Ser. No. 09/757,185 is utilized. It is believed that such an improvement will constitute an advancement in the art of electronic packages.

OBJECTS AND SUMMARY OF THE INVENTION

It is, therefore, a primary object of the present invention to enhance the electronic packaging art.

It is another object of this invention to provide an improved method for attaching a heat sink to an overmold or similar structure which forms part of an electronic package.

It is yet another object to provide such a method which can be relatively easily performed in an expeditious manner and at relatively reasonable cost.

According to one aspect of the invention, there is provided an improved method for bonding a heat sink to an electronic package comprising roughening the silicone-containing surface of the dielectric material prior to applying the adhesive to the surface and/or the heat sink.

According to another aspect of the invention, there is provided an improved method of marking a dielectric material of an electronic package wherein the dielectric material has a surface with a quantity of silicone thereon and the marking involves the deposition of a predetermined pattern of ink onto the surface, the improvement comprising roughening the surface of the dielectric material prior to the deposition of the predetermined pattern of ink.

According to yet another aspect of the invention, an electronic package is provided which comprises a substrate, a semiconductor chip positioned on and electrically coupled to the substrate, an overmold substantially covering the semiconductor chip, the overmold including a roughened upper surface having a quantity of silicone thereon, a quantity of adhesive positioned on the roughened upper surface, and a heat sink secured to the roughened upper surface by the quantity of adhesive.

BEST MODE FOR CARRYING OUT THE INVENTION

The need for the present invention as it relates to electronic packages with dielectric overmold (encapsulant) covering material protecting the encased chip(s) arises from difficulty in uniformly bonding heat sinks to the encapsulants. To encourage the release of encapsulated components from a mold, silicone oil or other mold release compounds are frequently included in the polymer encapsulant. Since such mold release compounds encourage release from the mold, these also often prevent a secure adhesive bond between the encapsulant and a heat sink. The problem is that the surface to be bonded to a heat sink must either be silicone free or the adhesive must be able to nevertheless bond with the encapsulant. This problem has been encountered in the production of plastic ball grid array (PBGA) packages, in particular, PBGA packages with an overmold covering electronic components mounted on the PBGA. Essentially, the silicone oil in the overmold prevented the adherence of a room temperature curing two part adhesive that was intended to bond a heat sink to the overmold. Accordingly, Ser. No. 09/757,185 and its parent application (now U.S. Pat. No. 6,206,997) addressed this problem and discovered that use of a pressurized plasma to at least partially convert the silicone residue on the dielectric's surface to silica resulted in an improved bond between the dielectric (encapsulant) and heat sink.

As will be understood from the description herein, the present invention represents an improvement to such bonding procedures, including improving the method taught in Ser. No. 09/757,185.

Figure 1:
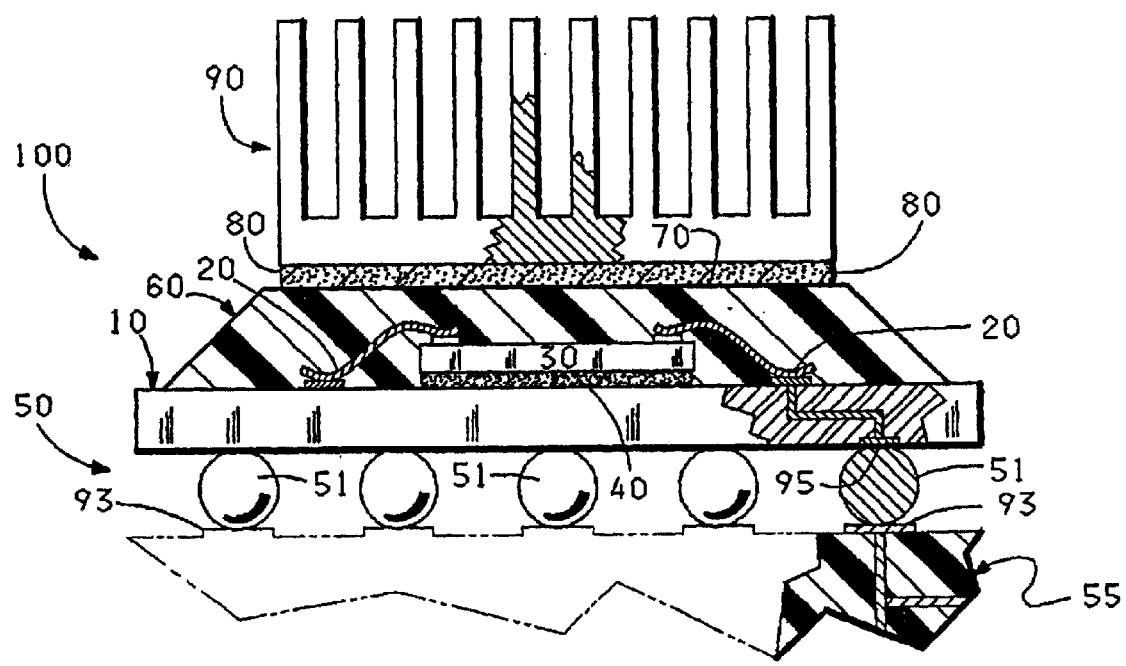
FIG. 1 is an enlarged side-elevational view, partly in section, of an electronic package according to one embodiment of the invention.

Referring to FIG. 1, a plastic ball grid array (PBGA) package 100 is shown. PBGA package 100 includes a semiconductor device 30 mechanically connected to a laminate 10 by a laminate adherent material 40 and electrically connected to laminate 10 by device interconnects 20 (i.e., wirebonds). Laminate 10 additionally includes a ball grid 50 comprised of several solder balls 51, which are used to connect PBGA package 100 electrically and/or mechanically to other devices, for example, to a printed circuit board 55 (shown partly in phantom). Also shown in FIG. 1 is overmold 60, a molded polymer formed over semiconductor device 30 and device interconnects 20 by transfer molding. A heat sink 90 is in turn mechanically connected to overmold 60 by overmold adherent material 80 placed on overmold surface 70. Provided that overmold adherent 80 is at least partially heat conductive, heat generated by semiconductor device 30 will be conducted to heat sink 90 and dissipated to the surrounding environment of package 100. Even though FIG. 1 shows PBGA package 100 with heat sink 90 bonded thereto by overmold adherent material 80, it should be noted that the present invention is applicable to other packages, as well as articles that need bonding to such other packages to become a part thereof. In particular, the present invention is applicable to bonding any article to the surface of a molded polymer, wherein a silicon-containing residue or the like on the surface of the molded polymer prevents forming a heat conductive, uniform bond between the article and the surface.

Accordingly, a preferred embodiment of the present invention provides a method whereby the interference of silicone oil or other silicon-containing residues on the overmold's external surface(s) may be overcome in forming a heat conductive bond between a molded polymer and an article, for example, heat sink 90. The method as taught herein also provides for effective ink marking of such overmolded packages wherein silicon is present on the overmold's external surface(s).

Package preparation requires the forming of the relatively solid (cured) overmold over the chip and connections 20. Once hardened, it is next essential to suitably position and fasten the package's intended heat sink.

As defined clearly in U.S. Pat. No. 6,206,997, the package, sans heat sink (and adhesive 80), may be subjected to a plasma exposure step. It is to be understood, however, that such a plasma exposure is not needed to properly secure a heat sink using the teachings of the instant invention. That is, effective heat sink attachment to the underlying overmold material may be attained without such exposure plasma treatment. It is possible, however, to use the teachings herein during a package assembly process in which such plasma exposure occurs to even further reinforce the resulting heat sink-overmold bond. Accordingly, further description of such an exposure step will be provided hereinbelow. Reference is also directed to U.S. Pat. No. 6,206,997 (beginning at col. 4, line 36).

In such a procedure, the plasma conditions are maintained for a sufficiently long time to convert substantially all of any silicone oil or other silicon-containing residue on the surface that will interfere with bonding to its silica. Preferably, the plasma is an oxygen plasma and, more preferably, the oxygen plasma is maintained for about 3 minutes in a reactive ion etch (RIE) chamber), or equivalent. A suitable plasma will be produced by establishing a pressure of about 0.35 torr in the RIE chamber with an oxygen flow rate of about 75 standard cubic centimeters/minute (sccm) while delivering about 300 watts of generator power. The type of plasma and plasma conditions selected may vary depending upon the particular silicon-containing residue and the type of polymer used for the molded polymer, as well as other factors. However, as taught in U.S. Pat. No. 6,206,997, the proper conditions can be quickly determined through trial plasma exposures followed by visual and/or chemical analysis of the treated surface by scanning electron microscope (SEM). By comparing the surface topography prior to treatment and after treatment, one of ordinary skill in the art can determine when a topography change has occurred, indicating at least partial conversion of the surface residue to silica. Silica is a glass derivative that will exhibit a different texture or topography compared to a polymer material used in a typical electrical component encapsulant. Specifically, the topography changes from a surface that appears relatively smooth at a magnification of about 5000× to a surface that appears much more rough in texture. Once the needed conversion (or at least part thereof) has taken place, the heat sink will be attached in the manner defined hereinbelow.

For some applications, it may be advisable to bake out moisture from overmold 60; otherwise, moisture may escape from the overmold while curing and possibly form steam pockets in the overmold adherent material 80. Moisture bakeout typically occurs at a temperature below the curing temperature for a period of several minutes, depending on the particular material from which overmold 60, or other encapsulant, is formed. For example, moisture will be suitably baked out at 125° C. applied for about 1 hour. Even though it may be advisable in some applications to eliminate steam pockets in overmold adherent material 80, it may be more advisable to avoid exposing semiconductor device 30 to heat. Some heat exposure will generally be required to cure overmold adherent material 80; however, it is often advisable to minimize heat exposure by eliminating steps such as a moisture bakeout if possible.

With the package 100 now assembled to the point of having overmold 60 in prepared form, yet where no adherent material 80 has been applied thereto, the next step according to the present invention is to roughen the overmold's top surface 70. Such roughening is preferably accomplished using an appropriate abrasive material, e.g., steel wool, a 500 grit sandpaper or pad (e.g., a "Scotchbrite" pad available from the Minnesota Mining and Manufacturing Company (3M)). The abrasive is rubbed, e.g., by suitable mechanical means (not shown), across surface 70 a total of from about 5 to 10 times (strokes). The invention is not limited to this particular range, however, as more or fewer strokes may be used depending on the abrasive, surface characteristics, etc. A procedure involving a relatively mild sandblasting of surface 70 is also possible. It is understood that prior to such treatment, surface 70, if not subjected to the aforedefined plasma step, will contain the described silicon-containing residue. If exposed to such plasma, some silicon residue may still be present. In both situations, the residue may prevent subsequent effective adhesion of heat sink 90 using adhesives of the type defined herein (see more below). It has been shown that by roughening surface 70 in the manner defined herein, significant improvement in heat sink adhesion has resulted.

Following roughening of surface 70, the surface is cleaned (e.g., with alcohol). The cleaned surface is now ready for adhesive application. One type of adherent material according to one embodiment of the present invention is a silicone-based paste adhesive with a metal oxide filler. Such a silicone-based adherent material is preferred because it is believed that the silicone in the adhesive interacts with the silica formed on the overmold surface 70 (if overmold 60 has been exposed to a plasma step as mentioned above) to produce a stronger bond between heat sink 90 and overmold surface 70. The metal oxide filler or, more preferably, alumina filler also improves the heat conductivity of overmold adherent material 80, such that heat is adequately conveyed from semiconductor device 30 to heat sink 90, regardless of which surface (plasmatreated or not) is produced. One such adhesive is sold under the product name 1-4373, and is available from Dow Corning Corporation (Midland, Mich.). This material is preferably cured at a temperature of about 130 to 160 degrees Celsius (° C.), or more preferably 150° C., for about 30 to 80 minutes (min), or more preferably 60 min, without applying any pressure. Prior to curing, an initial placement pressure of about 1 to 3 pounds per square inch (psi) is preferably applied for about 1 to 60 seconds (sec), or more preferably 10 sec, to squeeze out excess adhesive between overmold surface 70 and heat sink 90. Other adhesives known to those skilled in the art may also be in keeping with the above criteria and thus work well with the invention, but may have different curing conditions.

When using an adhesive called "Loctite 384", available from Loctite Corporation (Rocky Hill, Conn.), it has also been discovered that a successful bond between heat sink and overmold is possible by curing the assembled elements at room temperature. A relatively short initial cure period (from about 5 to about 10 minutes) proved sufficient to the extent that release of the mating fixtures and movement of the assembled elements to the next process step was possible. Full cure of this adhesive occurs at room temperature after 12 hours. Obviously, room temperature cure results in a less costly manufacturing operation for the resulting package, primarily due to the lack of need for a heating source (e.g., furnace) and thus represents a significant advantage over adhesives requiring thermal curing at elevated temperatures.

Prior to final positioning of heat sink 90, it is preferred to securely (and electrically) couple this subassembly to the desired host substrate (e.g., a PCB 55). To accomplish this, the subassembly is precisely aligned such that the package's solder balls 51 respectively align with conductor pads (e.g., copper pads) 93 on PCB 55. Solder reflow now occurs, resulting in an effective electrical coupling betwen the PCB's pads 93 and corresponding conductive sites 95 (e.g., copper pads) on laminate 10. Only one site 95 is clearly seen in FIG. 1, it being understood that each of the illustrated solder balls 51 is coupled to a respective one of such sites. As further seen in FIG. 1, pads 93 may also be coupled to the PCB's internal circuitry. Solder reflow temperatures as high as 240° C. were possible with no resulting harm to package 100.

With the subassembly now firmly in position, heat sink 90 is now attached, using the aforementioned adherent material 80.

Figure 2:
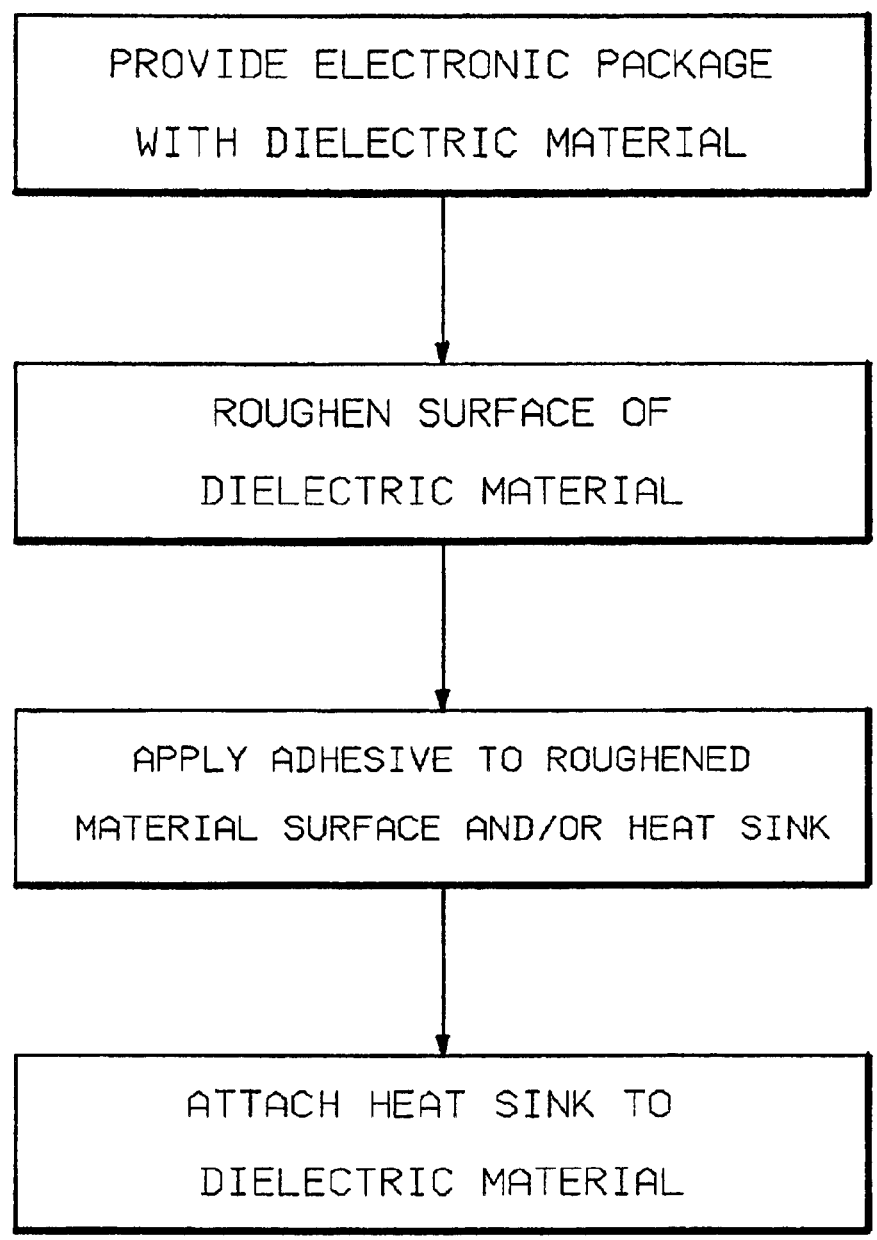
FIG. 2 is a flow chart representing the steps of bonding a heat sink to an electronic package according to one embodiment of the invention.
Figure 3:
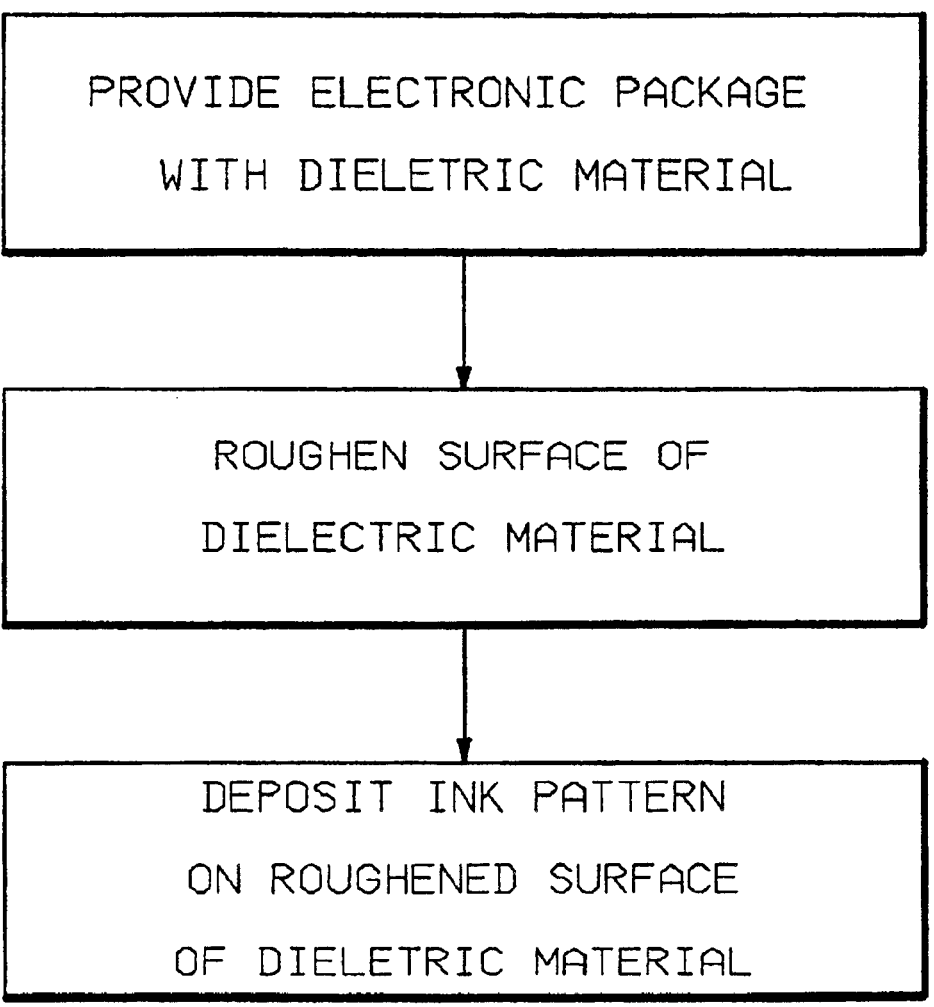
FIG. 3 is a flow chart representing the steps of marking an electronic package according to one aspect of the invention.

FIG. 2 represents a flow diagram of the aforedefined steps in attaching heat sink 90, excluding the interim step of coupling the subassembly to the host substrate (before heat sink attach).

As indicated earlier, the invention is not limited to heat sink-to-overmold attachment processing. It has been learned that using the teachings herein, appropriate inked messages (e.g., product descriptors, indicia, etc.) may be successfully applied to selected external surfaces of overmold 60 in the case of a package such as package 100, typically before heat sink attach. If these messages are to be applied to the top surface 70 of overmold 60, and if the heat sink possesses an accommodating deswign (e.g., an open center portion), such messages could be applied following heat sink attach. The invention is adaptable to other packages having overmold or similar dielectric materials as part thereof in which the formed surfaces will include silicone (e.g., residue) as part thereof. Such silicone has heretofore impeded ink pattern application of this type on such surfaces. Alternatively, such inking has required use of an ink pad onto which a stamp is depressed to collect the required amount of ink for marking.

Typically, such pads also include silicone and thus tend to leave a silicone film on the stamp which will prevent successful marking. The roughening step taught herein will assist in providing an improved stamping (marking) of such dielectric materials.

The present invention can also be used to improve the bond between the overmold and heat sink of page 100 in which the alternative, porous polymer film layer defined in U.S. Pat. No. 6,206,997 (beginning at col. 6, line 56) is utilized. The invention's roughened surface will enhance the bond between such a film and surface.

While there have been shown and described what are at present the preferred embodiments of the invention, it will be obvious to those skilled in the art that various changes and modifications may be made therein without departing from the scope of the invention as defined by the appended claims.

What is claimed is:

1. In a method of bonding a heat sink or similar member to a dielectric material of an electronic package wherein said dielectric material has a surface having a quantity of silicone oil or other silicon containing residue thereon and bonding said heat sink or similar member to said surface is accomplished by applying an adhesive to said surface and/or said heat sink, the improvement comprising roughening said surface of said dielectric material with an abrasive material prior to applying said adhesive to said surface and/or said heat sink and further including exposing said surface of said dielectric material to a plasma to convert substantially all of the silicone oil or other silicon containing residue to silica prior to said applying of said adhesive.

2. The method of claim 1 wherein said plasma is maintained at a pre-established pressure with a predetermined flow rate for an established time period.

3. The method of claim 2 wherein said pre-established pressure is about 0.35 torr, said predetermined flow rate is about 75 standard cubic centimeters/minute and said established time period is about 3 minutes.

4. The method of claim 3 wherein about 300 watts of power are generated daring said exposing said surface of said dielectric material to said plasma.

\* \* \* \* \*